United States Patent [19]

Andra

[11] Patent Number: 5,645,897

[45] Date of Patent: Jul. 8, 1997

[54] PROCESS AND DEVICE FOR SURFACE-MODIFICATION BY PHYSICO-CHEMICAL REACTIONS OF GASES OR VAPORS ON SURFACES, USING HIGHLY-CHARGED IONS

[76] Inventor: Jurgen Andra, Hammer Strasse 41b, D-48153, Muenster, Germany

[21] Appl. No.: 284,632

[22] PCT Filed: Jan. 30, 1993

[86] PCT No.: PCT/EP93/00214

§ 371 Date: Jan. 18, 1995

§ 102(e) Date: Jan. 18, 1995

[87] PCT Pub. No.: WO93/16213

PCT Pub. Date: Aug. 19, 1993

[30] Foreign Application Priority Data

Feb. 15, 1992 [DE] Germany .................. 42 04 650.5

[51] Int. Cl.[6] .................. C23C 14/04; C23C 14/00; H05H 1/30
[52] U.S. Cl. .................. 427/526; 427/530; 427/562; 427/571; 427/575; 427/569; 427/523; 216/66; 216/67; 216/70; 204/192.11
[58] Field of Search .................. 427/523, 524, 427/526, 561, 562, 566, 569, 571, 575, 596, 530; 216/65, 66, 68, 69, 70; 204/192.11, 192.13, 192.32

[56] References Cited

U.S. PATENT DOCUMENTS

| | | | |
|---|---|---|---|
| 4,281,030 | 7/1981 | Silfvast | 427/561 |
| 4,297,387 | 10/1981 | Beale | 427/561 |
| 4,452,679 | 6/1984 | Dunn et al. | 427/562 |
| 4,639,377 | 1/1987 | Vamamoto | 427/562 |
| 4,645,895 | 2/1987 | Boxman et al. | 427/562 |
| 4,657,774 | 4/1987 | Satou et al. | 427/527 |
| 4,670,064 | 6/1987 | Schachamayer et al. | 427/527 |
| 4,734,158 | 3/1988 | Gillis | 156/643 |
| 4,800,100 | 1/1989 | Herbots et al. | 427/255.2 |
| 4,987,007 | 1/1991 | Wagal et al. | 427/561 |
| 4,992,298 | 2/1991 | Deutchman et al. | 427/527 |
| 5,508,368 | 4/1996 | Knapp et al. | 427/562 |
| 5,534,311 | 7/1996 | Shaw et al. | 427/526 |

FOREIGN PATENT DOCUMENTS

| | | |
|---|---|---|
| 0209109 | 1/1987 | European Pat. Off. . |
| 0394735 | 10/1990 | European Pat. Off. . |

*Primary Examiner*—Marianne Padgett
*Attorney, Agent, or Firm*—Furgang & Milde, L.L.P.

[57] ABSTRACT

The invention concerns a process and a device for surface-modification by physico-chemical reactions with the following steps: a) contacting a solid surface having a crystalline or amorphous structure with a reactive, gaseous fluid (gas, gas mixture, vapour or vapour mixture) which is to interact with the surface; (b) supplying activating energy to the contact area between fluid and surface by means of ions or plasmas, in order to trigger reactions between said partners. In order to improve such a process and device, the activating energy is supplied as ions having at least a double charge and low kinetic energy or plasma streams with a sufficient proportion of ions having at least a double charge and low kinetic energy. The kinetic energy imparted to the ions is selected so that it allows the ions to closely approach the surface atoms but no to enter the surface.

20 Claims, 5 Drawing Sheets

PROCESS AND DEVICE FOR SURFACE-MODIFICATION BY PHYSICO-CHEMICAL REACTIONS OF GASES OR VAPORS ON SURFACES, USING HIGHLY-CHARGED IONS

BACKGROUND OF THE INVENTION

The invention concerns a process for surface-modification by physico-chemical reactions with the steps:

(a) contacting a solid surface having a crystalline or amorphous structure with a reactive, gaseous fluid (gas, gas mixture, vapor or vapor mixture) which is to interact with the surface, (b) supplying activating energy to the contact area between fluid and surface by means of ions or plasmas, in order to trigger reactions between said partners, as well as a device for the implementation of the process.

The process therefore includes for instance the coating or etching of surfaces by physicochemical reactions of reactive, gaseous fluids (gases, gas mixtures, vapors or vapor mixtures) at the surfaces, supported by plasmas or ion beams, which (a) deposit coatings on the surface by the interaction of the gases, gas mixtures or vapors at a surface with ion beams or a plasma, which are composed of radicals of said gases or vapors, or (b) erode (etch) surface atoms by the interaction of the reactive fluids at the surface with ion beams or with a plasma by forming volatile molecules from surface atoms and radicals of the said gases or vapors, or (c) desorb, and so erode or etch, respectively, surface atoms or -molecules by the interaction of the ions at the surface.

It is known, that processes employing ion beams and plasmas in the presence of gases or vapors, depending on the choice of these gases or vapors, are used for the etching of surfaces, or the coating of surfaces, or for the production of thin films on surfaces. A summary of the foundations and of the technical state of the art of these processes is found in three publications:

I. R. A. Haefer, "Oberflächen- und Dünnschicht-Technologie" ("Surface and Thin Film Technology") Part 2; "Oberflächenomodifikation durch Teilchen und Quanten" ("Surface Modification by Particles and Quanta") Series Werkstoff-Forschung und Technik (Materials Research and Technology), Volume 6, Springer 1991;

II: "Low Energy Ion Beam and Plasma Modification of Materials", eds. J. M. E. Harper, K. Miyake, J. R. McNeil, and S. M. Gorbatkin, Symposium Proceedings of the Materials Research Society, Vol. 223, Materials Research Society, Pittsburgh, USA, 1991;

III: Comptes Rendus des Travaux du "8ème Colloque International sur les Procédés Plasma" (Contributions to the "8th International Colloquium on Plasma Processes"), Le Vide les Couches Minces, Supplement 256, 1991, referred to as I, II, and III, respectively.

Subsumed to the term "Surface-Modification" have to be particularly surface-coating and surface-etching.

For the coating of surfaces from gases or vapors, energy has to be locally supplied at the surface for the physico-chemical reaction of the gases or vapors to create bonding with the surface, in order to obtain the coating of the surface with the desired compound. That is why thermal energy supply allows for instance to produce $Si_3N_4$-coatings on $SiO_2$-films by streaming gases of $SiH_4$ and $N_2$ against surfaces of $SiO_2$-films heated to high temperatures (>600° C.). Such processes are called "Chemical Vapor Deposition", CVD. For many applications the CVD-process faces, however, the disadvantage to work only at high temperatures.

It is known, published application of the German Patent Office DE 4020816 A1, referred to as D1 in the following, to improve the CVD-process by special devices for the transport of reactants towards the surface, in order to obtain coatings with higher purity. To that end, in D1 for instance, substances are activated (ionized) by various methods and accelerated, then electromagnetically separated, and then decelerated and neutralized before they react at the surface to form a coating.

It is known, to work at reduced surface temperatures by supplying the energy for the physico-chemical reaction at the surface by impinging singly charged ions with kinetic energy. The ions may stem from a plasma or from an especially prepared ion beam.

In the case of a convectional plasma, one speaks of "Plasma Enhanced (or Activated) Chemical Vapor Deposition", PECVD or PACVD. With it one obtains a reduction of the surface temperature for the $Si_3N_4$-coating, described above, to about 300° C. With the more recent "Electron Cyclotron Resonance", ECR-plasmas, this temperature can be further reduced to about 150° C. One speaks then of ECR-PECVD, which is applied already, but is still subject of research for all its possible applications. On the progress with ECR-PECVD on the production of diamond coatings from the gas mixture of $CH_4$ and $H_2$ has been reported [F. Roy, M. Mermoux, B Marcus, III, pages 353 to 355].

The replacement of the plasma by an ion beam with single charge and energy allows a still better localization and concentration of the energy supplied for the CVD at or on the surface of the substrate and so allows a further reduction of the temperature of the substrate. This energy is mainly supplied by the absorption of the kinetic energy of the ions in the first surface layers in the form of a surface activation. One speaks therefore of "Ion Activated CVD", IACVD. This IACVD is of particular interest, since gases or gas mixtures which adsorb at the surface are activated together with the surface only by the ion bombardment and the resulting solid compounds are deposited as films. This technology yields good coating results especially at low temperatures (i.e. −100° C.) of the substrates [M. Hirose, H. Shin, S. Miyazaki, and Y. Hriike, III, pages 105 to 112]. The type of ion is at free choice, so that ions of the coating to be deposited can be used, which yields coatings with higher purity. By using low energy $C^+$-ions for instance, diamond crystal coatings with high purity could be produced [J. W. Rabalais and S. Kasi, Science 239, (1988), page 623]. The tribologically important transition metal-nitride or -carbide coatings can also be well produced by using $N^+$- or $C^+$-ions.

For the surface etching with gaseous reactive fluids (gases or vapors), energy has to be locally supplied at the surface for the physico-chemical reaction of the gases or vapors with the surface. This energy mainly serves to liberate reactive radicals from the gas molecules which form together with the surface atoms volatile molecules and do so erode the surface. On hot Silicon surfaces, for instance, very reactive, neutral fluorine atoms are separated from $CF_4$ (tetrafluoromethane) which form volatile $SiF_4$ at the Si-surface and do so erode the Si-surface on a large scale.

When the dissociation is energetically supported by a plasma, for instance, reactive ions are also formed which serve for an increased etching of the surface. In the preceding example, $CF_3^+$-ions add to the etching besides the neutral fluorine atoms. In this case one speaks of "Reactive Ion Etching", RIE. The ions may have kinetic energies up to some 100 eV and do so not only dissociate the gas molecules, but cause also a physicochemical activation of the surface atoms. Since this activation depends on the direction of impact of the ions, spatially directed etching can be achieved in particular when the ion production is spatially separated from the region of the substrate. A directed ion beam can then interact with the substrate; the etching gas streams simultaneously towards the substrate. One then speaks of "Reactive Ion Beam Etching", RIBE. As examples may serve the etching of $Al_2O_3$ or Au by $Cl^+$ ions supported by simultaneous streams of $CCl_4$ or $C_2F_4Cl_2$[I, chapter 7.6, pages 205 to 217].

It is an advantage of the RIBE-process that the gases or gas mixtures which adsorb on the surface are activated together with the surface only by the ion bombardment, combine with molecules (atoms) from the substrate and do so allow a well controlled etching of the surface. This technology yields precise etching results especially at low temperatures (e.g. $-100°$ C.), where the gases or gas mixtures are well adsorbed [M. Hirose. H. Shin, S. Miyazaki, and Y. Horiike, III, pages 105 to 112; R. Petri, J. -M. Francou, D. Henry, and A. Inard, III, pages 94 to 97].

In these ion assisted coating- or etching processes ion bombardment is disadvantageous that the kinetic energy of the ions, which is necessary for the creation of the local surface activation or for the local physico-chemical activation, is so high that a damage of the material beneath the surface and of the coating already deposited can not be avoided. These material defects have important consequences. Experiments have shown that electronic or opto-electronic components produced with these processes had too high a density of defects and could therefore not be used. Long lasting annealing processes had to be applied therefore, which ruined the technological advantages of the production process [D. Lootens, P. Clauws, P. Van Daele, and P. Demeester, III, pages 292 to 294].

SUMMARY OF THE INVENTION

A principal object of the invention is, to improve the aforementioned processes in order to avoid the damage of the material to be modified beneath its surface and of the coatings already deposited. The time consumption for the annealing of these defects could thus be reduced and the productivity could thus be considerably improved.

This object, as well as other objects which will become apparent in the discussion that follows, is achieved, in accordance with the present invention, by supplying the activating energy as ions having at least a double charge and low kinetic energy or plasma streams with a sufficient proportion of ions having at least a double charge and low kinetic energy. The kinetic energy imparted to the ions is selected so that it allows the ions to closely approach the surface atoms but not to enter the surface.

In other terms, the surface of the material to be treated is bombarded with ions having at least double charge and low kinetic energy, where the potential energy of the ions, corresponding to their high charge, is used for activating the surface, the gas molecules adsorbed at the surface, or the gas molecules just in front of the surface. The ions can approach the surface atoms but can not penetrate the surface.

As mentioned already, surface modification is understood to represent particularly etching, coating or depositing. The coating or etching of surfaces is obtained by the interaction of highly charged ions with low kinetic energy with the surface, with the gases or vapors adsorbed at the surface, or with the gas molecules just in front of the surface. Contrary to the use of the relatively high kinetic energy for the physico-chemical activation in the known RIE-, RIBE, PECVD-, or IACVD-processes, it is the potential energy stored in the highly charged ion which is used for the coating and etching of the surfaces. The relatively low kinetic energy of the highly charged ions is only necessary to closely approach the surface atoms or molecules to be activated. The electronic interaction of highly charged ions with a surface has on the one hand side an influence on the electronic state of the ion by electron exchange between the surface and the ion, and on the other hand on the trajectory of the ion by the attractive force of the image charge, which, for the case of electrically conducting surfaces, is equal to the effective charge of the ion in front of the surface. At electrically non conducting surfaces this force is strongly reduced and can become zero. The electron exchange from the material's surface towards the highly charged, incoming ion sets in, in terms of atomic units of length $a_0=0.0529$ nm, at great distances $z_c$ in front of the first atomic layer of the surface, which is assumed to be located at $z=0$.

It is of significance for the invention that the highly charged ion, on its further path from $z_c$ to a distance $z=d$ in front of the first atomic layer, resonantly captures electrons from the surface into highly excited states, and so reduces its initial charge, or becomes neutralized in front of conducting surfaces, respectively, where d is the average lattice distance between atoms in the surface plane. Since these electrons stem from the conduction or valence band of the surface material, respectively, or from valence electrons of adsorbed atoms or molecules, the resonance energy is determined by the binding energy of these bands or of these valence electrons.

By this "aspiration" of (valence-) electrons from the surface local bondings of adsorbed atoms or molecules will be strongly reduced so that they become physico-chemically activated (excited). By this activation atoms or radicals of the adsorbed molecules can form new bondings and can so produce a coating of the surface, or, depending on the choice of the adsorbed atoms or molecules, can create with surface atoms volatile molecules and can so erode (etch) the surface, well before the incoming, initially highly charged ion arrives at the close vicinity (Z<d) of the surface atoms. At semi-conducting up to non-conducting, clean surfaces this "aspiration" of valence electrons can directly produce Coulomb-desorption, i.e. erosion (etching) of surface atoms or -molecules without support from adsorbed atoms or molecules.

It can be assumed that the ion dives, in the range of $0<z<d$, into the electron density of the surface which decays exponentially into the vacuum, so that the electronic screening of the surface atoms as well as of the ion core become reduced. This results in a repulsive Coulomb force between the ion core and all nearby surface atoms, or all nearby adsorbed atoms, respectively. For $Ar^+$ ions at a distance of 1.0 $a_0$ in front of the surface atom-, or adsorbed atom nuclei, respectively, this repulsive potential reaches values of the order of 20 eV (for Mg) up to 116 eV (for Pt), that is on the average about 65±45 eV for all surface elements from the lowest to the highest atomic number and correspondingly higher values for higher charged Ar-ions with effective charge >1. Depending on its effective charge $q_{eff}$ in this spatial region in front of the surface an initially highly charged ion will be totally reflected if its initial kinetic energy amounts to $E_0<(65\pm45)\cdot q$ eV. Since $q_{eff}$ is unknown as yet, the lowest possible kinetic energies of the highly charged ions are required in order to guarantee a total reflection of the ions at the surface. To obtain total reflection at the collective surface potential, is essential for the invention, since practically no surface atom can be expelled from the material's surface by transfer of kinetic energy in a collision between the ion and a single surface atom. The reduction of the rate of sputtering when lowering the kinetic energy of singly charged ions has definitely been demonstrated (H. Gnaser and H. Oechsner, Surface Science 251/252, 1991, pages 696 to 700; see also J. Muri and Ch. Steinbrüchel, II, pages 41 to 46).

At electrically conducting surfaces one has to subtract another energy $E_B$ from the defined limit of energy $E_0$ which results from the acceleration of the ions by the image charge. It is composed of two terms which geometrically correspond to the regions $z>z_c$ and $z_c>z>d$, respectively. In the first region one has to use the initial charge q of the ion, yielding a gain of energy $E_{B1}=27.2\cdot q/z_c$ eV up to the distance $z_c$ from the surface. In the second region, the effective charge of the ion is unknown, so that only a rough estimate is possible. Under the assumption of limited screening by highly excited electrons in the essentially neutralized atom, one may adopt $q_{eff}=q/2$ and so obtains $E_{B2}=27.2\cdot(q/2)\cdot(d^{-1}-z_c^{-1})$ eV. As limiting energy for total reflection one thus obtains on the average $E_0(65\pm45)\cdot(q/2)-E_{B1}-E_{B2}$, which corresponds to approximately $E_0-(29\pm23)\cdot q$ eV. Depending on the surface material one therefore has to choose the limiting initial energy of the highly charged ions below $6\cdot q$ and $52\cdot q$ eV in order to guarantee the total reflection of the ions at the surface and thus a negligible sputtering by the ions, that is a treatment of the surface with little damage.

Depending on the surface material and on the choice of $E_0$, distances of closest approach $z_0$ between surface atoms or -molecules and the ion during the total reflection are expected to range from 0.5 to 2.0 $a_0$. These are distances at which the initially highly charged, but on its path from $z_c$ to $z_0$ neutralized ions, with the captured electrons in external shells, can capture electrons directly from filled inner shells of the surface atoms or -molecules into its own, still partially empty inner shells. Quasi-resonant electron exchange processes or inter-atomic Auger neutralization processes are responsible for this electron capture, which takes place with a probability close to 1 for each particular ion at the turning point of its trajectory when it comes close enough to a surface atom or to an atom or molecule adsorbed at the surface.

This creates a very strong physical excitation of the surface atoms or of the atoms or molecules adsorbed at the surface, which results, due to the loss of electrons, in a strong Coulomb repulsion and therefore in the desorption of the atom in question, or, if the potential energy deposited is not sufficient for it, is transformed into an extremely localized thermal and chemical activation. This condition of a minimum approach towards the atoms to be activated is as important for the claimed process as the condition of total reflection.

The very low energy of the incoming ions has therefore not only to be selected following the criterion of total reflection, but has to be adapted such that the ions can come close enough to the surface atoms or to the atoms or molecules adsorbed at the surface, where close is defined by the diameter of the orbits of the inner shell electrons to be captured. The resulting optimized ion energies will thus depend on the ion species and on the material to be physico-chemically activated, so that theoretical estimates as well as experimental determinations will be required from case to case.

It is essential for the invention that every low energy, initially highly charged ion extracts, in the range of some nanometers in front of the surface, many valence electrons and, at the turning point of its trajectory at the surface, at least one if not several inner shell electrons from a surface atom or -molecule or from an adsorbed atom or -molecule. A high physico-chemical activation is so obtained with a spatial accuracy of a few nanometers for coating or etching, and a particularly high activation is so created with a spatial accuracy of sub-nanometers which especially supports the etching by additional desorption. With respect to the deposition of kinetic energy, which extends over some tens to thousand nanometers due to the deceleration of energetic, singly charged ions, the energy deposition with highly charged ions, with low kinetic but high potential energy is very well localized and allows therefore the coating or etching with spatial resolutions of the order of nanometers. This is a decisive advantage of the claimed process.

If the spatial resolution or anisotropy of the coating or etching is not required, it can be taken advantage of the great cross section for electron capture of $10^{-14}$ to $10^{-15}$ cm$^2$ from free atoms or molecules, which are situated at a distance $\geq 5$ nm from the surface, into highly charged ions. The atoms are ionized and the molecules are divided into partially ionized radicals by this electron loss, so that very reactive particles for coating and etching are produced. In order to produce these reaction partners in the close vicinity of the surface, it has to be assured that the gases, gas mixtures, or vapors stream towards the surface at low pressure (about 1 Pa) in a layer of only a few millimeters, since the average free path of highly charged ions amounts then only to a few millimeters. Simultaneously it has to be considered that the ion trajectory up to this gas layer has to experience a vacuum of better than $10^{-2}$ Pa, so that the ion penetrates this gas layer still in its high charge state. When these differential pumping conditions are met, large scale coating or etching with coat or etch rates of several 100 nm s$^{-1}$ at ion current densities of several $q\cdot mA\cdot cm^{-2}$ can be achieved due to the creation of several reactive radicals by each ion, where q is the charge if the incoming ions.

If, however, high spatial resolution or anisotropy of the coating or etching is required, the production of reactants from the gaseous fluid at distances greater than the required resolution from the surface has to avoided. This becomes possible by the particularly efficient physico-chemical activation of atoms or molecules adsorbed or condensed at the surface. Adapting the rate of activation by a corresponding ion current density of about q mA·cm–2 of highly charged ions to the rate of adsorption of the gases, gas mixtures, or vapors, one can obtain vacuum conditions at which the ions arrive with a probability near 1 with their initial charge in the close vicinity of the surface (<3 nm) and activate there coating or etching at rates of about 30 nm per second. The claimed process is particularly advantageous for the adsorption or condensation of the gases, gas mixtures, or vapors, since it can be applied at all temperatures of the substrate. It leads therefore especially at low temperatures of the substrate (e.g. −100° C.) to very good results of coating or etching, since the totally reflected ion beam does not create a thermal load of the coating or of the surface material. The advantageous vacuum conditions can be further improved by applying pulsed gas-, gas mixture-, or vapor beams, so that precise ion optical imaging systems can be applied without being afraid of the scattering of the ions at gas particles. Highly charged ions of strongly reactive gases can so be applied for an etching process, so that a minimum of additional fluid is required; for the borderline case one may etch even without additional fluid.

In addition to the above, the invention is further characterized by the following features:

The advantageous vacuum conditions can be further improved by applying pulsed gas-, gas mixture-, or vapor beams, so that precise ion optical imaging systems can be introduced without being afraid of the scattering of the ions at gas particles.

Since highly charged ions of low kinetic energy can also be used for the cleaning and smoothing of surfaces, one can apply in the same vacuum vessel many successive steps of processing of the surface modification from the first cleaning of the surface of the substrate up to the very complex structuring on the nanometer scale by using precise ion optical imaging and corresponding variable gas dosage, and can so obtain a high productivity.

In summary one can conclude, that the advantages of the invention are mainly based on the fact that the coating and etching of surfaces with little damage results mainly from the potential energy stored in highly charged ions, in contrast to the use of the kinetic energy of singly charged ions in processes applied thus far. The invention described will improve the productivity in all production processes, where RIE-, RIBE, PECVD-, or IACVD-processes are used, by reduction of the rejects due to damage, which will largely compensate the higher investments necessary for the claimed process. The invention quoted in the claims will produce a significant improvement of the precision of the spatially resolved and anisotropic coating and etching, which will allow a deeper etching and higher coating at simultaneously greater structural density, so that completely new technologies and areas of production will emerge. In all production processes, which had to work without the application of RIE-, RIBE-, PECVD-, or IACVD-processes for reasons of costs, the process of the invention can reduce the costs by improving the quality and thus by reducing the rejects to such an extend, that it will impose itself in the fabrication of micro- and nano-structures.

When working on electrically semi-conducting to non-conducting surfaces of substrates, the charging of the surface by the incoming positively charged ions can be compensated by simultaneous or intermittent sprays of electrons with low kinetic energy.

A further explanation of the invention follows with examples and an explanation of the embodiments shown in the figures.

DESCRIPTION OF THE PREFERRED EMBODIMENTS

EXAMPLE 1

Figure 1:
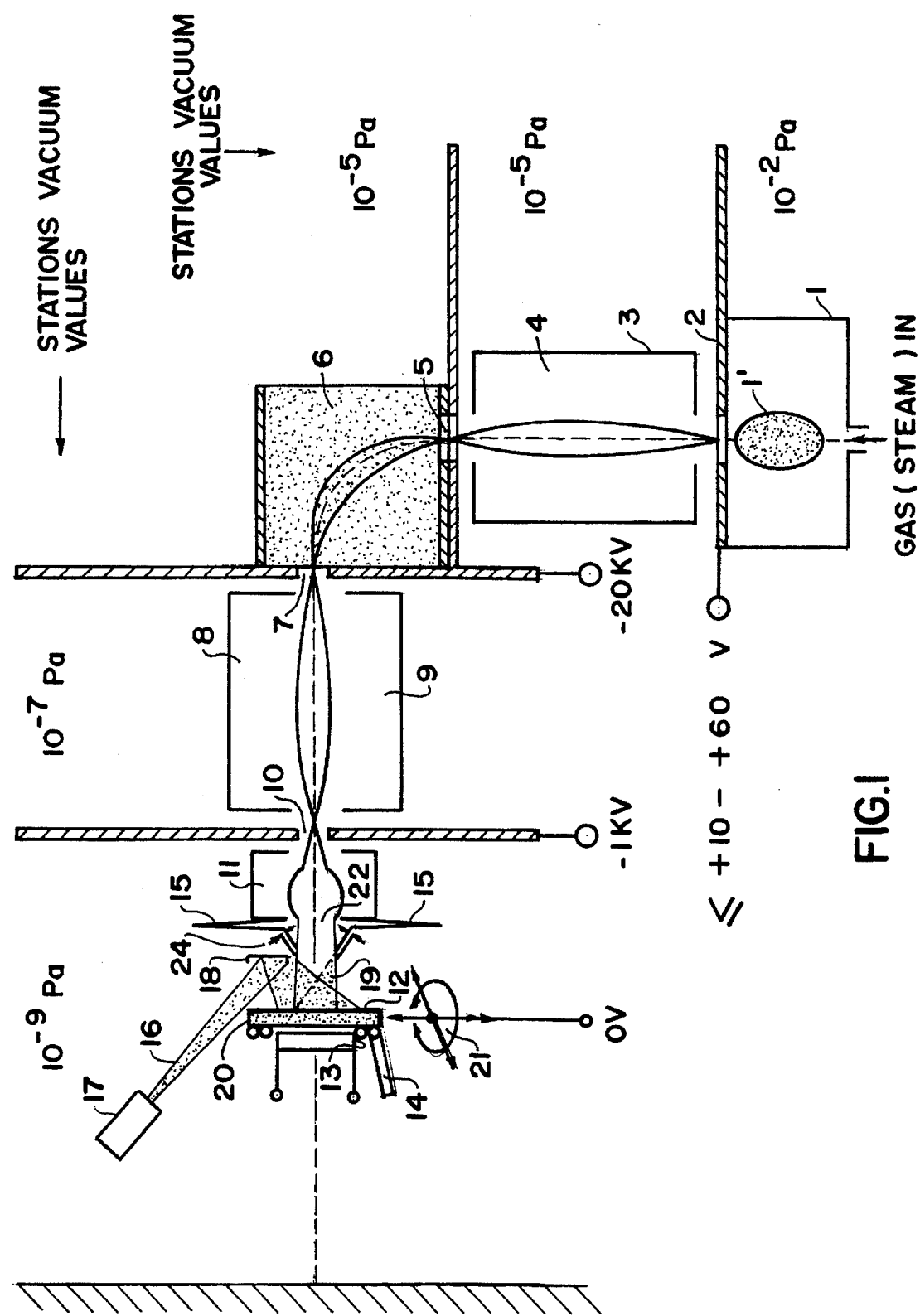
FIG. 1 is a schematic diagram of a first arrangement or embodiment with which a modification of a surface by coating or etching can be performed.

(see FIG. 1)

FIG. 1 shows a schematic presentation of a first arrangement of a device to carry out the process, as it can be set up with nowadays technology. The figure of reference 1 shows an ion source with a modest vacuum ($10^{-2}$ Pa). $CH_4$ is fed into this ion source and transformed into a plasma 1' with variously charged C-atoms.

In the ion source 1 with the plasma 1' various C-ions are produced with an average charge $q_m \approx +5$. The exit aperture of the ion source is at a potential U below +10 and about +60 V. With an extraction electrode 2 and an electrostatic extraction lens 3, both on a potential of (e.g.) −20 kV, ions with a mixture of charge states are extracted and are accelerated to (20000+U)·q eV into a zone of pressure of $10^{-5}$ Pa. The extraction lens 3 focuses these ions through entrance aperture 5 into a double focusing sector-magnet 6 or into an ion optical device for q/m-separation, so that ions with a single charge state, here e.g. $C^{5+}$, are focused through the exit aperture 7.

This exit aperture serves simultaneously as differential pumping diaphragm, through which the ions enter into a zone of pressure of about $10^{-7}$ Pa. There the ions are decelerated by a first deceleration lens 9 from (20000+U)·q eV to e.g. (1000+U)·q eV and are focused through a second differential pumping diaphragm 10. This allows the set up of a second deceleration lens 11 and the positioning of a surface to be coated 12 in an ultra-high vacuum of about $10^{-9}$ Pa. The ions, selected with respect to their q/m, are decelerated in the deceleration lens 11 from (1000+U)·q eV to U eV and hit the surface 12 with low energy, which in this case is a silicon single crystal substrate (wafer) for the chip production. For the thermal conditioning of the surface 12 a heating 13 and/or a cooling device 14 are provided. A (schematically indicated) orientation device 21 is provided in order to adjust various angles of impact on the substrate 20. The feeding of the gas, gas mixture, or vapor is provided in this example through nozzles 15, which are arranged symmetrically around the ion beam axis, in order to achieve a homogeneous stream of gas 19 onto the surface hit by the ion beam 22.

Valves 24 (e.g. piezo-ceramic valves) are provided just in front of the nozzles 15 which allow a pulsing of the gas stream. In this example a mixture of $CH_4$ and $H_2$ is used to produce a diamond coating of the silicon single crystal. Diamond is a metastable form of carbon. For its formation it requires an additional activation energy which is supplied by the $C^{5+}$-ions. The potential energy of the ion produces at impact in a very short time a very localized (<some nm²) electronic and thermal activation, which may be understood as high local temperature. The carbon is transformed by this high, local electronic and thermal activation in the presence of H-atoms into the desired diamond structure. The subsequent very rapid decay of the local electronic and thermal activation stabilizes the diamond structure.

EXAMPLE 2

(see FIG. 1)

Alternatively, the production of a molecular beam of the desired material by sputtering with a $Ar^+$-ion beam 16 of about 1 to 5 keV kinetic energy is shown in FIG. 1. The ion beam is produced in a Ar-ion source 17 and is directed onto the material to be sputtered 18 right in front of the surface 12 to be coated. The material to be sputtered 18 is e.g. solid boron, which as a consequence of the sputtering with the Ar-ions hits a metal surface 12 as B- atomic- and $B_2$- molecular beam. At the metal surface it interacts with a beam 22 of low energy, highly charged nitrogen ions for the production of a coating of boron nitride (BN). In order to obtain a still better homogeneity of the coating, rotations and linear displacements of the substrate 20 with its surface 12 are provided by a schematically shown orientation device

21. Depending on the application other vacuum conditions and other conditions of acceleration and deceleration can be used.

EXAMPLE 3

Figure 2:
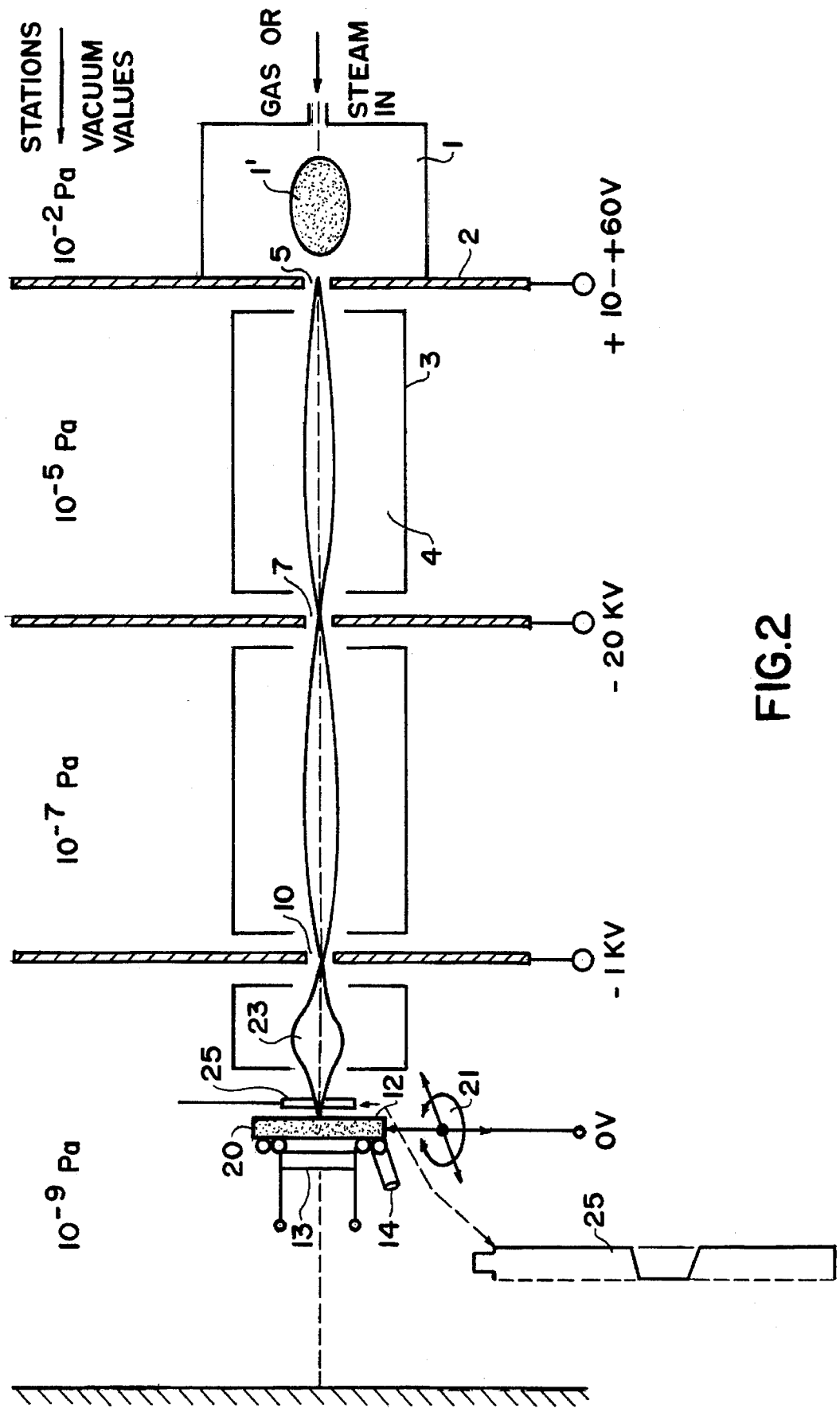
FIG. 2 is a schematic diagram of a second embodiment.

(see FIG. 2)

Example 3 corresponds to example 1 with respect to essential details, except for the omission of the q/m separating unit.

$SiH_4$ streams into the ion source 1 and is dissociated into ions. The whole mixture of charge states of Si ions, as extracted from the plasma 1' of the ions source 1, hit the surface 12, which here is a $SiO_2$-film on a wafer, with an energy $U \cdot q$ eV. This increases the total stream of particles onto the surface 12 and therefore also the coating power, but decreases on the average the physico-chemical activation, since, besides the highly charged ions, a high fraction of only singly and doubly charged ions will be present in the stream of particles. These ions contribute less to the physico-chemical activation than the highly charged ones. It is therefore important to use ion sources which can produce streams of particles with an optimum average charge state. The optimum is defined economically and technologically, since the technological effort of the construction of the ion source can be adapted to the lowest charge state of an ionized element with which efficient coating powers can be obtained corresponding to the invention.

The feeding of gas is provided in this example by a perforated matrix of nozzles 25, through which a mixture of $SiH_4$ and $N_2$ streams as homogeneously as possible onto the $SiO_2$-film on the surface 12, where a $Si_3N_4$-coating is deposited in interaction with the Si-ions. Since the ion beam 23 is focused in this example through the hole in the nozzle-matrix 25, the substrate 20 with the surface 12 can be moved multi-parametrically with the device 21, in order to allow either for a homogeneous large scale coating or for coating inscription with $Si_3N_4$ on the $SiO_2$-film. For the optimum temperature for this coating of the surface a heating 13 and/or a cooling device 14 have to be provided, using one of the known systems. Depending on the application other vacuum conditions and other conditions of acceleration and deceleration can be used.

EXAMPLES 4

Example 4 corresponds to example 1 with respect to essential details, except for the fact that the whole set up from the ion source up to the surface to be treated is built in ultra-high vacuum technology ($10^{-9}$ Pa). In this way the greatest cleanness of the apparatus becomes possible at vacuum conditions at choice. At corresponding operation of the ion source the differential pumping diaphragms 7 and 10 can then be eliminated.

EXAMPLES 5

Example 5 corresponds to example 3 with respect to essential details, except for the fact that the whole set up from the ion source up to the surface to be treated is built in ultra-high vacuum technology ($10^{-9}$ Pa). In this way the greatest cleanness of the apparatus becomes possible at vacuum conditions at choice. At corresponding operation of the ion source the differential pumping diaphragms 7 and 10 can then be eliminated.

EXAMPLE 6

Figure 3:
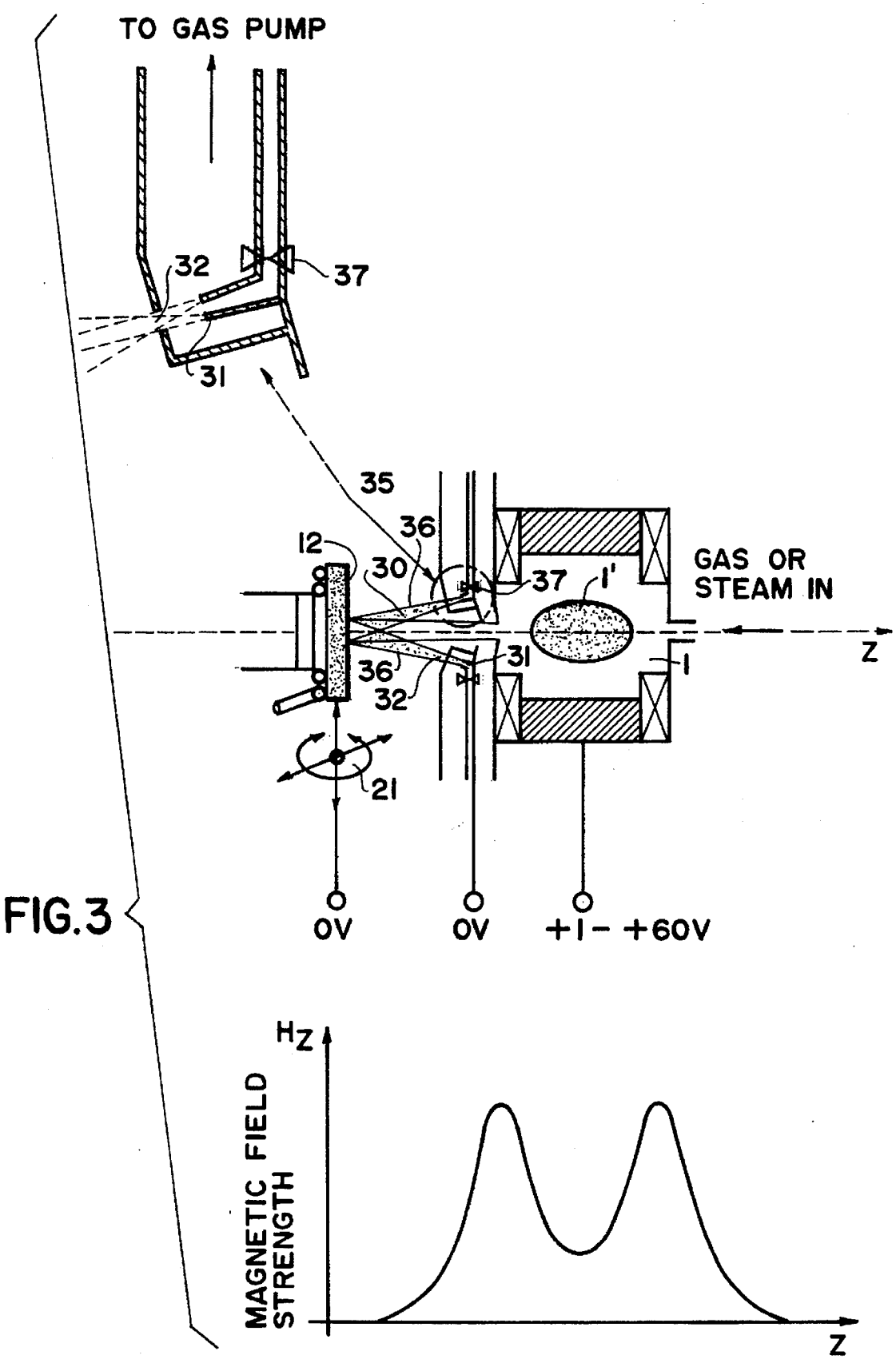
FIGS. 3 and 4 are schematic diagrams of further embodiments.

(see FIG. 3)

A mixture of charge states 30 is extracted as stream of particles, here of fluorine ions, from an ion source 1 with $U \cdot q$ eV directly in the direction onto the surface 12, here a Si single crystal, where the extraction voltage is $\approx +1$ V$<$U$<\not=+$60 V. In comparison to example 1 no q/m-separation and no ion-optical imaging takes place; the differential pumping stages are also eliminated. As in FIG. 1 valves 37 can be provided, however, to pulse the molecular beam.

The total stream of particles onto the surface 12 and therefore the etching power are increased, but the physico-chemical activation is decreased on the average, since, depending on the ion source, besides the highly charged ions, a high fraction of only singly and doubly charged ions will be present in the stream of particles 30 which contribute less to the activation than the highly charged ones. It is therefore important to use ion sources which can produce streams of particles with an optimum average charge state. As mentioned already, the optimum is defined economically and technologically. The magnetic field distribution is shown in the diagram in the lower part of FIG. 3.

Since sources for highly charged ions mostly work with high magnetic field confinement of the ions and electrons, this example can only be applied in situations where magnetic stray fields do not disturb the further treatment of the surface. The gas feeding is provided in this example in the form of molecular beams 36, which are defined by nozzles 31, apertures 32 and differential pumpings 35. In this way a very homogeneous stream, of $SiF_4$ e.g., onto the surface is achieved, in order to imprint, due to the interaction with the Si-ions, a precise etching pattern into the Si-surface through a mask which had been deposited by lithographic methods onto the surface. The Si-surface can be moved multi-parametrically with the device 21, in order to achieve a still better large scale homogeneity of the etching or obtain particular etch profiles. For the optimum temperature for this etching a heating 13 and/or a cooling device 14 have to be provided, using one of the known processes. Depending on the application other vacuum conditions and other conditions of acceleration and deceleration, e.g. by a different distribution of the magnetic field strength, can be used.

EXAMPLE 7

Figure 4:
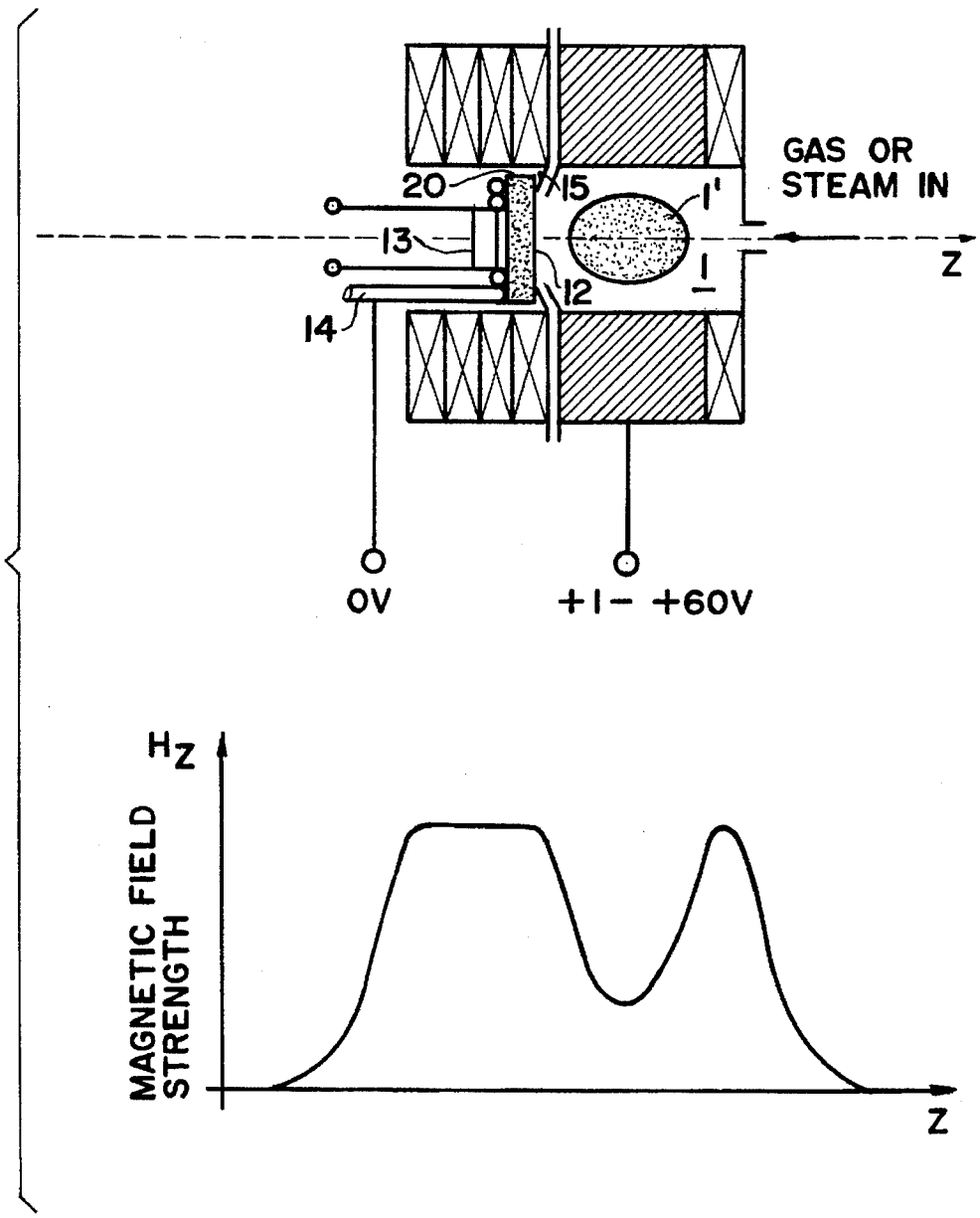

(see FIG. 4)

The total mixture of charge states of a plasma, here a chlorine plasma, is accelerated with $U \cdot q$ eV, where +1 V$<$U$<\approx +$60 V, directly onto the surface 12, here a substrate 20 with an $Al_2O_3$-surface, which is a wall of the plasma volume 1. The vacuum conditions can be adapted to the particular application. With respect to the example 6 a further simplification has thus been introduced. All further explanations of the example 6 are to be applied to example 7 as well. As in the example 6 it is important to use a configuration of the plasma production (plasma 1') which ensures a content of optimum average charge state. The optimum is defined here economically and technologically. This example resembles very much the technical setup of the known plasma-etching according the ECR-principle, where a plasma with low average charge state is mixed with chemical substances in order to erode surfaces via plasma enhanced chemical reactions (see I, chapter 5, pages 138 to 157).

The decisive difference of example 7 is the use of a plasma with high average charge state ($q_m >> 2$), which may also be produced by the ECR-principle, but requires a high magnetic plasma confinement, as it not used for the plasma etching as yet. The FIG. 4 explicitly shows one of many possible arrangements according to the ECR-principle with high magnetic plasma confinement, with axial plasma confinement in an axial magnetic field, the relative strength of which is indicated, and with a radial plasma confinement by an as high as possible magnetic multipolar field.

The gas feeding, $CCl_4$ e.g., is provided in this example by effusion from nozzles 15 which are arranged symmetrically around the axis and which produce in the region of the surface an increased density of $CCl_4$. By the interaction with the Cl-ions a precise etching pattern can so be imprinted on the $Al_2O_3$-surface through a mask, produced by lithographic methods on the $Al_2O_3$-surface. The $Al_2O_3$-surface can be rotated in order to produce certain etch-profiles by means of the Cl-ions, which move predominantly parallel to the axis of the system. The motion of the ions parallel to the axis of the system is enhanced by the presence of the homogeneous magnetic field in the region of the surface. For the optimum temperature for this etching a heating 13 and/or a cooling device 14 have to be provided, using one of the known processes. Depending on the application other vacuum conditions and other conditions of acceleration and deceleration can be used.

EXAMPLE 8

Figure 5:
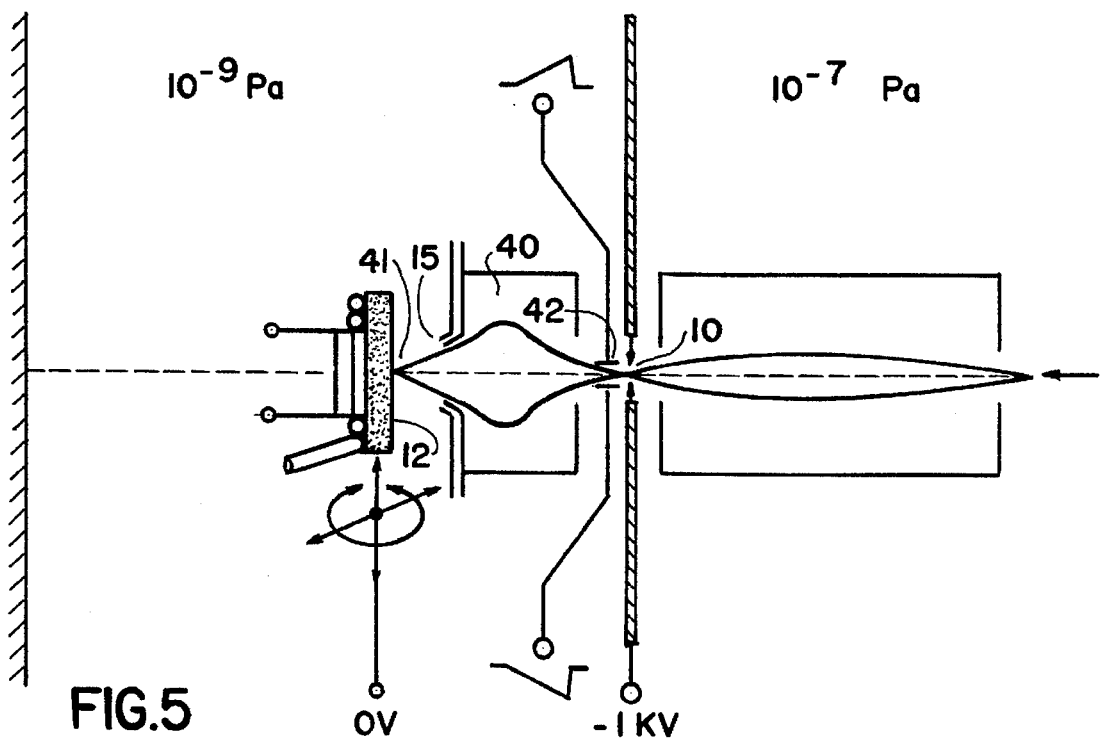
FIGS. 5 and 6 are schematic diagrams showing a specialization of the first two embodiments.

(see FIG. 5)

The example 8 is based on the examples 1–5 and uses just in front of the surface 12 ion optical elements, which allow a sharp focusing of the ion beam, here e.g. Ti-ions, and a controlled electromagnetic guidance of this focus on the surface. They may also allow a sharp imaging of a semi-transparent mask on the surface 12, here e.g. a metal. With this method a TiN-coating pattern can be imprinted on the surface by feeding $N_2$-gas through the nozzles 15 for instance. Since many arrangements exist for the electromagnetic guidance of a ion beam focus and for the imaging of a semi-transparent mask on the surface, only one possibility is shown in FIG. 5. In the device in FIG. 5 a differential pumping diaphragm 10 is set up as aperture with very small and variable radius, which is imaged with ion optical components 40 on a very sharp focus 41. In the direction of the ion beam behind this aperture an electromagnetic deflection system 42 is provided which allows the controlled guidance of the focus 41 on the surface 12.

EXAMPLE 9

Figure 6:
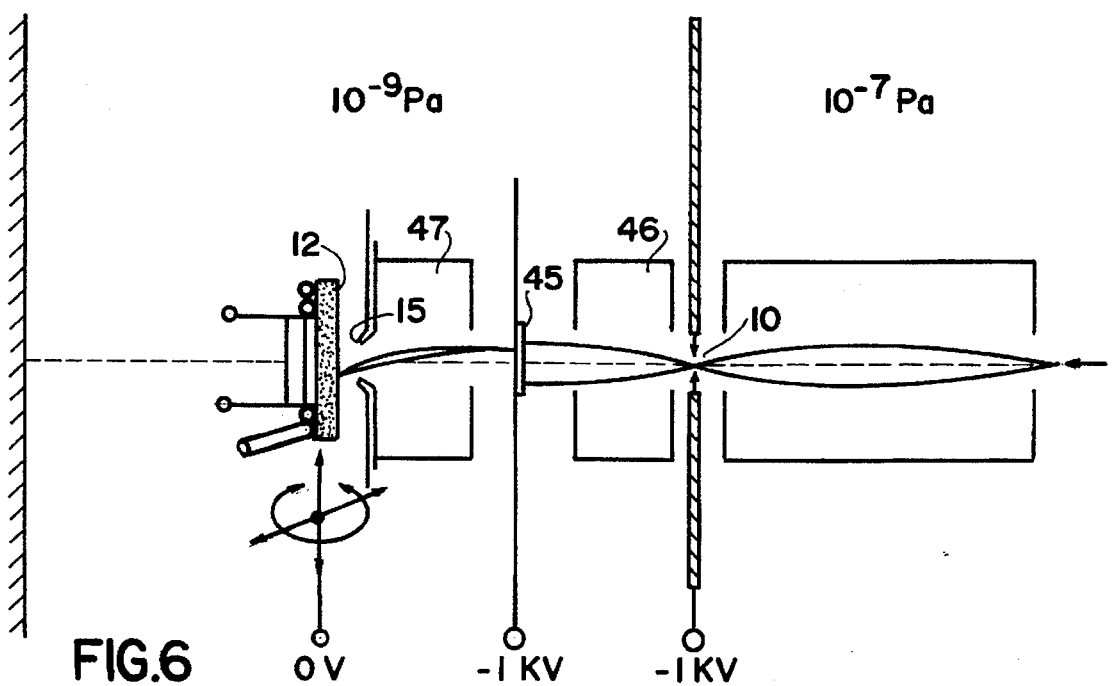

(see FIG. 6)

A further arrangement is shown in FIG. 6 which illuminates the semi-transparent mask 45 parallel to the axis by a first set of ion optical components 46, and then images this mask 45 with a second set of ion optical components with a good focus on the surface. By means of this mask an etching pattern may be imprinted on a Pt-surface by using $CBrF_3$-gas and low energy, highly charged F-ions.

There has thus been shown and described a novel process and device for surface-modification by physicochemical reactions of gases or vapors on surfaces, using highly-charged ions which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

I claim:

1. In a process for surface modification by physicochemical reactions, said process comprising the steps of:
    (a) contacting a solid surface having a crystalline or amorphous structure with a reactive, gaseous fluid which is to interact with the surface; and
    (b) supplying activating energy to both said fluid and said surface by means of ions or plasmas, in order to trigger reactions between said fluid and said surface,
    the improvement comprising providing an activating energy in the form of an electronic potential energy of ions having a charge of $q \geq 2$ with a low kinetic energy, or by streams of plasmas, which contain a high proportion of an arithmetically averaged charge state $\Sigma q \cdot f (g) = qm \geq 2$, where $f(g)$ is a fraction of particles in charge state $q = 0,1,2,\ldots$, with said low kinetic energy, wherein said low kinetic energy is below about $100 \cdot q$ eV and determined to meet a condition that said ions are allowed to closely approach atoms of said surface, but not to penetrate said surface.

2. The process according to claim 1, wherein the surface modification comprises an etching process.

3. The process according to claim 1, wherein the surface modification comprises a coating process.

4. The process according to claim 1, wherein the surface modification comprises a deposition process.

5. The process according to claim 1, wherein said fluid is provided as spatially homogeneous atomic or molecular ion beams directed toward said surface at an arbitrarily selected angle in a vacuum between about $10^{-2}$ and $10^{-9}$ Pa such that said low kinetic energy, ions are injected from a region of said vacuum traverse a limited region of gas, and then impinge said surface.

6. The process according to claim 1, wherein the surface modification is conducted at a surface temperature below 600° C.

7. The process according to claim 1, wherein one or several mono-layers of said fluid are adsorbed at said surface and are physicochemically activated by said low kinetic energy ions.

8. The process according to claim 1, wherein further comprising the step of adsorbing a portion of said fluid at said surface by either:
    (i) providing said low kinetic energy ions as a continuous ion beam and supplying said fluid in the form of pulses of defined quantity corresponding to one to three mono-layers of said adsorbed fluid at said surface or
    (ii) providing said low kinetic energy ions as intermittent pulses of ions and supplying fluid pulses of said fluid having defined quantity of said fluid corresponding to one to three mono-layers of adsorbed fluid, a quantity of an ion pulse being adapted to a necessary activating energy of said adsorbed mono-layers
    a flux and an adsorption of said fluid at said surface being adapted to said continuous ion beam or said ion pulses such that said ions statistically interact with a fresh mono-layer of said adsorbed fluid.

9. The process according to claim 1, wherein said fluid is produced by sputtering a solid material with ions having a sufficient kinetic energy to cause said sputtering.

10. The process according to claim 9, wherein said solid material is boron.

11. The process according to claim 1, wherein said process of surface modification is started with a stream of highly charged ions, having a high kinetic energy sufficient to penetrate said surface, directed at said surface which is subsequently changed to a stream of said low kinetic energy ions whereby said high kinetic energy ions penetrate into said surface at the beginning of the etching process, or to improve adhesion at the beginning of a coating process by the linking to crystalline defects.

12. The process according to claim 1, wherein said activating energy is provided as a stream of said ions of an element which represents a significant constituent of said surface to be modified.

13. The process according to claim 1, wherein said highly charged ions are:

produced in an ion source;

extracted, and optionally separated with respect to a charge to mass ratio (q/m);

transported to a processing chamber; and decelerated to said low kinetic energy per charge in front of said surface to be modified.

14. The process according to claim 1, wherein an angle of incidence, a position of impact, and a size of an impact spot of said ions on said surface to be modified are controlled.

15. The process according to claim 1, wherein said ions are produced in a region with magnetic plasma confinement by feeding energy via electron beams or via microwaves employing electron cyclotron resonance, and wherein the plasma with low kinetic energy ions is brought into direct contact with said surface to be modified.

16. The process according to claim 1, wherein one or more devices selected from the group consisting of an electron-cyclotron-resonance ion source with magnetic plasma confinement, an electron impact ion source, and an electron beam ion source is used to produce said ions.

17. The process according to claim 1, wherein said highly charged ions irradiates a perforated mask which is imaged onto said surface, such that an etched or coated image of said mask is produced on said surface.

18. The process according to claim wherein said fluid homogeneously streams out of a matrix of nozzles on to said surface, and wherein said low kinetic energy ions are injected from a region of vacuum sufficient to impinge said surface and impinge said surface through holes in said matrix of nozzles.

19. The process according to claim 1, wherein the reactions take place at a surface temperature of below 0° C.

20. The process according to claim 1, wherein said kinetic energy of said ions is between about 1·q eV and 60·q eV.

* * * * *